United States Patent [19]
Chan et al.

[11] Patent Number: 5,500,557
[45] Date of Patent: Mar. 19, 1996

[54] STRUCTURE AND METHOD FOR FABRICATING INTEGRATED CIRCUITS

[75] Inventors: Tsiu C. Chan, Carrollton; Frank R. Bryant, Denton; Lun-Tseng Lu, Carrollton, all of Tex.; Che-Chia Wei, Singapore, Singapore

[73] Assignee: SGS-Thomson Microelectronics, Inc., Carrollton, Tex.

[21] Appl. No.: 126,673

[22] Filed: Sep. 24, 1993

Related U.S. Application Data

[63] Continuation of Ser. No. 876,405, Apr. 30, 1992, abandoned.

[51] Int. Cl.$^6$ ................................................. H01L 23/48
[52] U.S. Cl. ..................... 257/758; 257/384; 257/768; 257/776
[58] Field of Search ........................... 257/758, 756, 257/768, 776, 900, 384

[56] References Cited

U.S. PATENT DOCUMENTS 4,980,752  12/1990  Jones, Jr. .................. 257/763
5,066,995  11/1991  Young et al. ............... 257/384
5,130,782  7/1992   Ashwell ..................... 257/758

*Primary Examiner*—Mark V. Prenty
*Attorney, Agent, or Firm*—Kenneth C. Hill; Lisa K. Jorgenson; Richard K. Robinson

[57] ABSTRACT

A structure and method for fabricating integrated circuits which provides for the detection of residual conductive material. A first conductive layer is deposited over the integrated circuit and patterned to define a first interconnect layer. An insulating layer is then formed over the integrated circuit. A second conductive layer is then deposited and patterned to define a second interconnect layer. Residual conductive material can be formed during patterning of the second interconnect layer when portions of the second conductive layer remain adjacent to the vertical sidewalls of the first interconnect layer. To make the residual conductive material easier to detect, the conductivity of the residual conductive material is increased by either implanting impurities into the integrated circuit or siliciding the residual conductive material with a refractory metal.

20 Claims, 3 Drawing Sheets

STRUCTURE AND METHOD FOR FABRICATING INTEGRATED CIRCUITS

This is a continuation of application Ser. No. 07/876,405, filed Apr. 30, 1992 and now abandoned.

BACKGROUND OF THE INVENTION

1. Field of the Invention

The present invention relates generally to integrated circuits, and more particularly to a structure and method for fabricating integrated circuits which provides for the detection of residual conductive material.

2. Description of the Prior Art

Complex integrated circuits typically contain multiple components on one device. Consequently, multiple layers of interconnect are needed to connect various sections of the integrated circuit together. A problem arises, however, when fabricating a polycrystalline silicon interconnect layer over an underlying interconnect layer or an insulating layer having steps or sidewalls. When the polycrystalline silicon interconnect layer is patterned, residual conductive material of polycrystalline silicon is formed adjacent to the sidewalls of the underlying interconnect or insulating layer. Residual conductive material can also be left in small geometric areas on the integrated circuit. This residual conductive material can connect sections of the overlying polycrystalline silicon interconnect layer together. And, because the residual conductive material is typically undoped or lightly doped, it has an intrinsic or near intrinsic resistivity. These resulting features can cause various reliability problems with the integrated circuit.

One method used to try and remove the residual conductive material is overetching the integrated circuit during fabrication. Those skilled in the art will recognize that significant overetching is required to ensure removal of the residual conductive material. Significant overetching, however, has the undesirable effect of damaging other materials. Consequently, the length of an etch is selected by balancing between the need to remove the residual conductive material, and the need to minimize the collateral damage. As a result of this balancing, residual conductive material will occasionally remain in an integrated circuit.

As stated above, the residual conductive material can cause reliability problems with an integrated circuit. If the integrated circuit is an SRAM, for example, residual conductive material can cause single bit failures in the individual cells. Alternatively, it can cause the SRAM cell to operate in a narrow voltage range or operate unreliably. Those skilled in the art will recognize that the resistivity of the residual conductive material can change over time. This change in resisitivity can cause the voltage range at which the SRAM operates to fluctuate, resulting in a flaky bit.

A SRAM cell which is known to have a problem may be salvaged by utilizing redundancy or laser repair. However, situations may still exist where a bit is marginal, and goes bad after fabrication and testing are completed.

Therefore, it would be desirable to provide a structure and method for fabricating integrated circuits which provides for the detection of residual conductive material. It is also desirable that such a structure and method not significantly increase the complexity of the fabrication process.

SUMMARY OF THE INVENTION

A structure and method for fabricating integrated circuits which provides for the detection of residual conductive material is disclosed. A first conductive layer is deposited over the integrated circuit and patterned to define a first interconnect layer. An insulating layer is then formed over the integrated circuit. A second conductive layer is then deposited and patterned to define a second interconnect layer. Residual conductive material can be formed during patterning of the second interconnect layer when portions of the second conductive layer remain adjacent to the vertical sidewalls of the first interconnect layer. To make the residual conductive material easier to detect, the conductivity of the residual conductive material is increased by either implanting impurities into the integrated circuit or siliciding the residual conductive material with a refractory metal.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
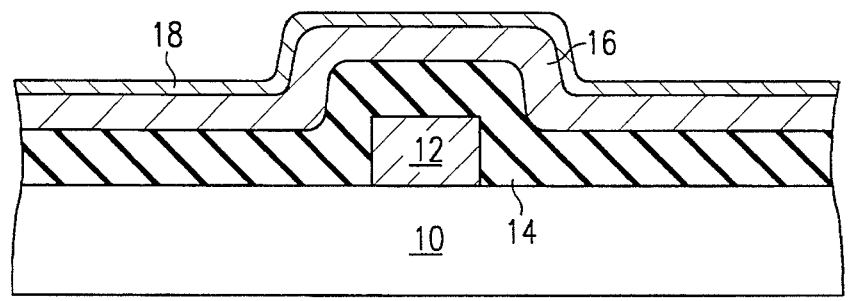
FIGS. 1–2 are sectional views of an integrated circuit illustrating a prior art structure and method for fabricating integrated circuits.
Figure 2:
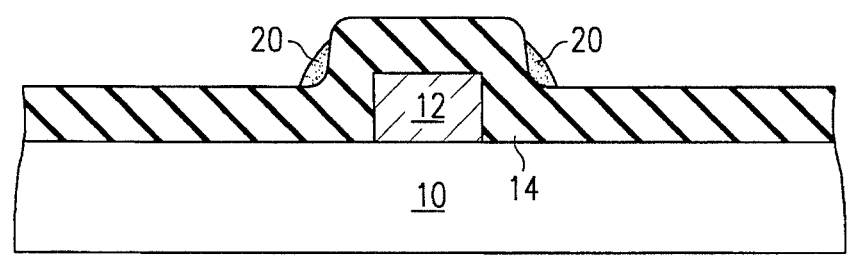

FIGS. 1–2 are sectional views of an integrated circuit illustrating a prior art structure and method for fabricating integrated circuits. Referring to FIG. 1, a first conductive layer is deposited over an underlying region 10 in an integrated circuit and patterned to define a first interconnect layer 12. The underlying region 10 can be either a semiconductor substrate or an interlevel dielectric layer, and the first interconnect layer 12 can be made of, for example, polycrystalline silicon.

An insulating layer 14 is then formed over the integrated circuit. A second conductive layer 16 made of polycrystalline silicon is then deposited over the integrated circuit. Typically, the upper surface 18 of the second conductive layer 16 is silicided or doped with impurities.

FIG. 2 illustrates the integrated circuit after the second conductive layer 16 is patterned to define a second interconnect layer (not shown), leaving residual conductive material 20 adjacent to the first interconnect layer 12. Residual conductive material 20 can also be left in small geometric areas on the integrated circuit or alongside sidewalls in the insulating layer 14. This residual conductive material 20 is commonly called stringers. Because the residual conductive material 20 lies below the silicided or doped surface 18 of the second conductive layer 16, the etch performed to pattern the second conductive layer 16 leaves residual conductive material 20 that is undoped or lightly doped. This causes the residual conductive material 20 to have an intrinsic or near intrinsic resistivity. The resistivity of the residual conductive material 20 can lead to reliability problems which are discussed below.

Figure 3:
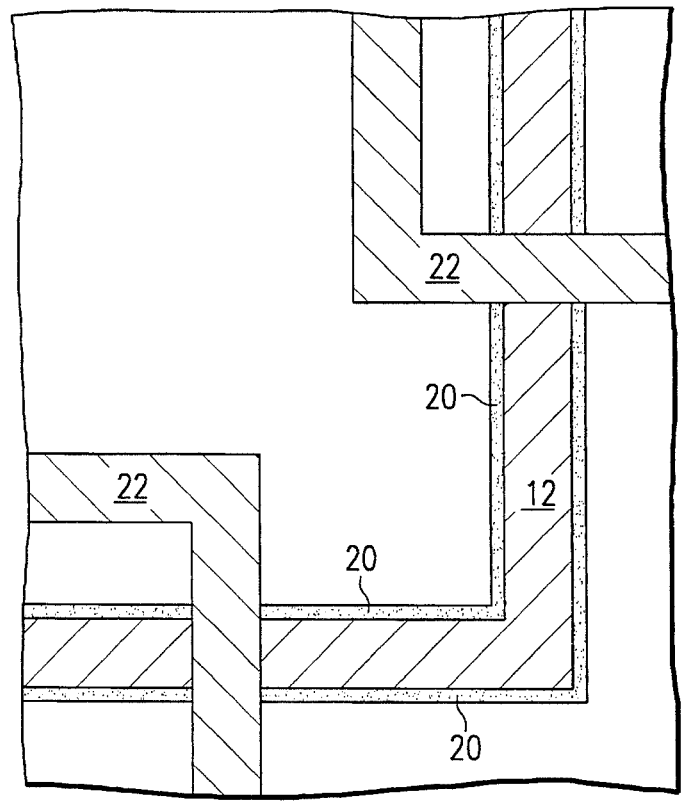
FIG. 3 is a top view of an integrated circuit illustrating a prior art structure and method for fabricating integrated circuits.

FIG. 3 is a top view of an integrated circuit illustrating a prior art structure and method for fabricating integrated circuits. The first interconnect layer 12 and a second interconnect layer 22 are formed on the integrated circuit. As can be seen, the second interconnect layer 22 overlies portions of the first interconnect layer 12. Because the residual conductive material 20 lies adjacent to the first interconnect layer 12, it connects various sections of the second interconnect layer 22 together. This can cause the second interconnect layer 22 to short out. For example, if the integrated circuit is an SRAM cell, the residual conductive material 20 may cause a single bit failure.

Alternatively, if the residual conductive material 20 is highly resistive, it can cause the SRAM to operate in a narrow voltage range. Those skilled in the art will recognize that over time the resistivity of the residual conductive material 20 can change. This change in resistivity causes the voltage range at which the SRAM operates to fluctuate, resulting in a flaky bit.

Figure 4:
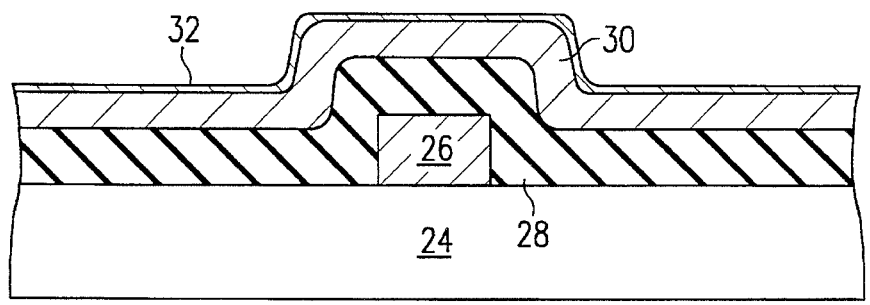
FIGS. 4–5 are sectional views of an integrated circuit illustrating a preferred structure and method for fabricating integrated circuits according to the present invention.
Figure 5:
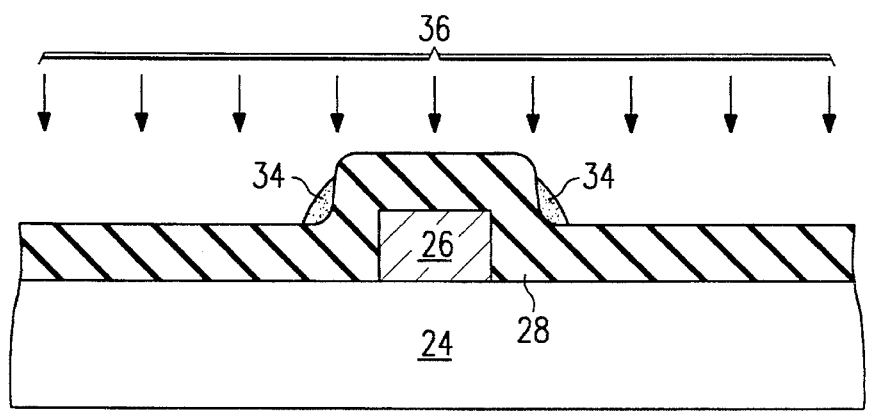

FIGS. 4–5 are sectional views of an integrated circuit illustrating a preferred structure and method for fabricating integrated circuits. Referring to FIG. 4, a first conductive layer is deposited over an underlying region 24 in an integrated circuit and patterned to define a first interconnect layer 26. The underlying region 24 can be either a semiconductor substrate or an interlevel dielectric layer, and the first interconnect layer 26 can be made of, for example, polycrystalline silicon.

An insulating layer 28 is then formed over the integrated circuit. In the preferred embodiment, the insulating layer 28 is made of oxide, but other insulating materials can be used. A second conductive layer 30 made of polycrystalline silicon is then deposited over the integrated circuit. Typically, the upper surface 32 of the second conductive layer 30 is silicided or doped with impurities.

FIG. 5 illustrates the integrated circuit after the second conductive layer 30 is patterned, leaving residual conductive material 34 adjacent to the first interconnect layer 26. Residual conductive material 34 may also be left adjacent to other steps or sidewalls in the insulating layer 28 (not shown). The upper surfaces of the integrated circuit and the residual conductive material 34 are then doped with impurities 36. In the preferred embodiment, the impurities are N-type impurities, with arsenic or phosphorus as examples. Doping the residual conductive material 34 with N-type impurities lowers its resistivity, making the presence of residual conductive material 34 easier to detect. For example, doping residual conductive material 34 which exists in an SRAM cell will force a bit failure to occur due to the short which it caused. Those skilled in the art will recognize that the bit failure can then be eliminated by redundancy repair.

Figure 6:
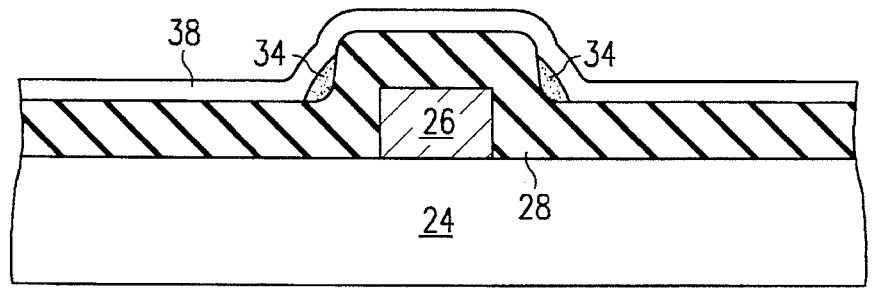
FIGS. 6–8 are sectional views of an integrated circuit illustrating an alternative preferred structure and method for fabricating integrated circuits according to the present invention.
Figure 7:
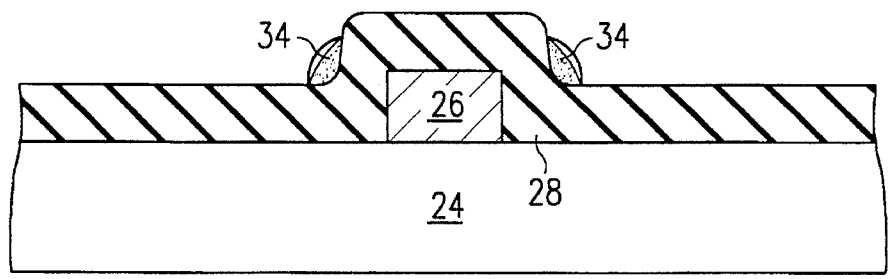
Figure 8:
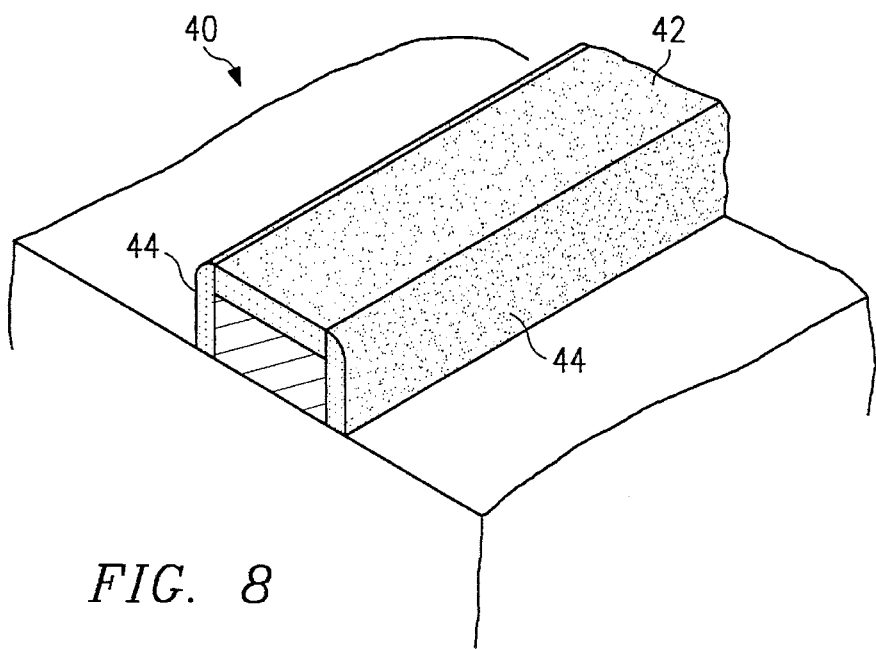

An alternative preferred structure and method for fabricating integrated circuits according to the present invention is shown in FIGS. 6–8. Referring to FIG. 6, the processing steps described with reference to FIG. 4 are performed and the second conductive layer 30 is patterned to form a second interconnect layer (not shown), leaving the residual conductive material 34. A layer of refractory metal 38 is then deposited over the integrated circuit. The layer of refractory metal 38 is preferably made of titanium, but other refractory metals can be used. The layer of refractory metal is then annealed to form silicided polycrystalline silicon regions. Silicide will form on the second interconnect layer and on any residual conductive material 34.

FIG. 7 illustrates the integrated circuit after the unreacted metal is stripped off using techniques known in the art, leaving the residual conductive material 34 and second interconnect layer (not shown) silicided. In the preferred embodiment, titanium nitride is stripped off leaving the titanium disilicide formed on the residual conductive material 34 made of polycrystalline silicon. Because the titanium disilicide is very conductive, the presence of polycrystalline silicon stringers formed in the integrated circuit is easily detected.

Referring to FIG. 8, a second interconnect layer 40 is shown after the processing steps described with reference to FIGS. 6–7 are performed. The upper surface 42 and sidewalls 44 of the second interconnect layer 40 are silicided. The upper surface 42 may also have been silicided prior to patterning the second conductive layer 30. Those skilled in the art will recognize that this does not alter the integrity of the second interconnect layer 40. The integrated circuit is now ready for further processing steps.

The processes described above provide structures and methods which provide for the detection of residual conductive material. This allows for corrective measures to be taken to ensure the reliability of the integrated circuit. Moreover, the methods described above do not significantly increase the complexity of the fabrication process.

While the invention has been particularly shown and described with reference to a preferred embodiment, it will be understood by those skilled in the art that various changes in form and detail may be made therein without departing from the spirit and scope of the invention.

What is claimed is:

1. A structure in an integrated circuit, comprising:

a first interconnect layer;

an insulating layer overlying the first interconnect layer the insulating layer having an upper surface over a lower region;

a second interconnect layer overlying portions of the insulating layer; and residual conductive material which lies adjacent to vertical sidewalls of the first interconnect layer, wherein the residual conductive material connects one section of the second interconnect layer to another section of the second interconnect layer, wherein the upper surface of the insulating layer and the residual conductive material are doped with an N-type impurity to enhance the conductivity of the residual conductive material and the upper surface of the insulating layer is more highly doped than the lower region of the insulating layer.

2. The structure of claim 1, wherein the first interconnect layer is made of polycrystalline silicon.

3. The structure of claim 1, wherein the insulating layer is made of oxide.

4. The structure of claim 1, wherein the second interconnect layer is made of polycrystalline silicon.

5. The structure of claim 1, wherein the residual conductive material is made of polycrystalline silicon.

6. A structure in an integrated circuit, comprising:

a first interconnect layer;

an insulating layer overlying the first interconnect layer;

a second interconnect layer overlying portions of the insulating layer; and residual conductive material which lies adjacent to vertical sidewalls of the first interconnect layer, wherein the residual conductive material connects one section of the second interconnect layer to another section of the second interconnect layer, and wherein the residual conductive material is silicided with a refractory metal.

7. The structure of claim 6, wherein the refractory metal is titanium.

8. The structure of claim 1, wherein the N-type impurities are arsenic.

9. A structure in an integrated circuit, comprising:

a first interconnect layer having an upper surface and a lower region;

an insulating layer overlying the first interconnect layer having an upper surface and a lower region; and a second interconnect layer overlying portions of the insulating layer, wherein the upper surface of the insulating layer and the upper surface of the second interconnect layer are doped with impurities such that the upper surface of the insulating layer and the upper surface of the second interconnect layer are more highly doped with impurities than the lower region of the insulating layer and the lower region of the second interconnect layer.

10. The structure of claim 9, wherein the first interconnect layer is made of polycrystalline silicon.

11. The structure of claim 9, wherein the insulating layer is made of oxide.

12. The structure of claim 9, wherein the second interconnect layer is made of polycrystalline silicon.

13. The structure of claim 9, wherein the impurities are N-type impurities.

14. The structure of claim 13, wherein the N-type impurities are arsenic.

15. A structure in an integrated circuit comprising:

a first interconnect layer;

an insulating layer overlying the first interconnect layer;

a second interconnect layer overlying portions of the insulating layer; and a residual conductive structure which lies adjacent to vertical sidewalls of the first interconnect layer, wherein the insulating layer is between the residual conductive material and the first interconnect layer, wherein the residual conductive structure connects one section of the second interconnect layer to another section of the second interconnect layer, wherein the residual conductive structure is silicided such that the residual conductive structure has increased conductivity.

16. The structure of claim 15, wherein the first interconnect layer is made of polycrystalline silicon.

17. The structure of claim 15, wherein the insulating layer is made of oxide.

18. The structure of claim 15, wherein the second interconnect layer is made of polycrystalline silicon.

19. The structure of claim 15, wherein the second interconnect layer is silicided with a refractory metal.

20. The structure of claim 19, wherein the refractory metal is titanium.

* * * * *